(12) United States Patent
Ling

(10) Patent No.: US 8,852,411 B2
(45) Date of Patent: *Oct. 7, 2014

(54) SPUTTERING APPARATUS

(71) Applicant: Hon Hai Precision Industry Co., Ltd., New Taipei (TW)

(72) Inventor: Wei-Cheng Ling, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/938,289

(22) Filed: Jul. 10, 2013

(65) Prior Publication Data

US 2013/0299348 A1     Nov. 14, 2013

Related U.S. Application Data

(62) Division of application No. 12/906,125, filed on Oct. 17, 2010, now Pat. No. 8,506,772.

(30) Foreign Application Priority Data

Apr. 22, 2010  (TW) ............................... 99112640 A

(51) Int. Cl.
| | |
|---|---|
| *C23C 14/00* | (2006.01) |
| *C25B 11/00* | (2006.01) |
| *C25B 13/00* | (2006.01) |
| *C23C 14/56* | (2006.01) |
| *H01J 37/34* | (2006.01) |
| *C23C 14/50* | (2006.01) |
| *C23C 14/02* | (2006.01) |
| *H01L 21/67* | (2006.01) |

(52) U.S. Cl.
CPC ............... *C23C 14/50* (2013.01); *C23C 14/56* (2013.01); *H01J 37/34* (2013.01); *H01L 21/6719* (2013.01); *C23C 14/02* (2013.01); *H01L 21/67207* (2013.01); *C23C 14/505* (2013.01)
USPC ................................. 204/298.15; 204/298.01

(58) Field of Classification Search
USPC ........................................ 204/298.15, 298.01
See application file for complete search history.

(56) References Cited

U.S. PATENT DOCUMENTS

| | | | | |
|---|---|---|---|---|
| 2,847,325 | A | * | 8/1958 | Riseman et al. ............... 427/101 |
| 5,961,798 | A | * | 10/1999 | Robinson et al. ......... 204/298.25 |
| 6,471,837 | B1 | * | 10/2002 | Hans et al. ................ 204/298.41 |
| 2008/0185354 | A1 | * | 8/2008 | Hopper et al. .................. 211/62 |
| 2009/0145745 | A1 | * | 6/2009 | Boling et al. ............ 204/192.13 |

\* cited by examiner

*Primary Examiner* — Keith Hendricks
*Assistant Examiner* — Ibrahime A Abraham
(74) *Attorney, Agent, or Firm* — Novak Druce Connolly Bove + Quigg LLP

(57) ABSTRACT

A sputtering apparatus includes a support assembly and posts. The support assembly includes an upper base, a lower base, seat members, and connection posts interconnected between the upper base and the lower base. The upper base defines cutouts. The seat members are rotatably mounted on the lower base and aligned with the cutouts. Each seat member includes a hollow receiving post, a support post moveably received in the receiving post, a lever bar pivotably connected to the receiving post, and a drive post, the drive post and the support post are coupled to opposite ends of the lever bar. Each seat member is rotatable about a longitudinal axis of the receiving post. The posts fix workpieces in place. Each post includes a rod body portion having a first end and an opposite second end, an engagement portion at the first end, and a protrusion extending from the second end.

10 Claims, 6 Drawing Sheets

SPUTTERING APPARATUS

CROSS-REFERENCE TO RELATED APPLICATION

This application is a divisional application of a commonly-assigned application entitled "SPUTTERING APPARATUS," filed on Oct. 17, 2010 with application Ser. No. 12/906,125. The disclosure of the above-identified application is incorporated herein by reference.

BACKGROUND

1. Technical Field

The present disclosure relates to coating technologies and, particularly, to a sputtering apparatus.

2. Description of Related Art

A sputtering apparatus for coating workpieces includes a preparation chamber, a deposition chamber, two support assemblies respectively positioned in the preparation chamber and the deposition chamber, and a number of posts for fixing the workpieces. The posts are transferred from the preparation chamber to the deposition chamber and are mounted on the respective support assembly. If the posts are not easily mounted on or easily demounted from the respective support assembly, the efficiency of the coating process will be decreased. Hence, the mounting and demounting efficiency of the posts is of great importance in coating apparatus design.

DETAILED DESCRIPTION

Figure 1:
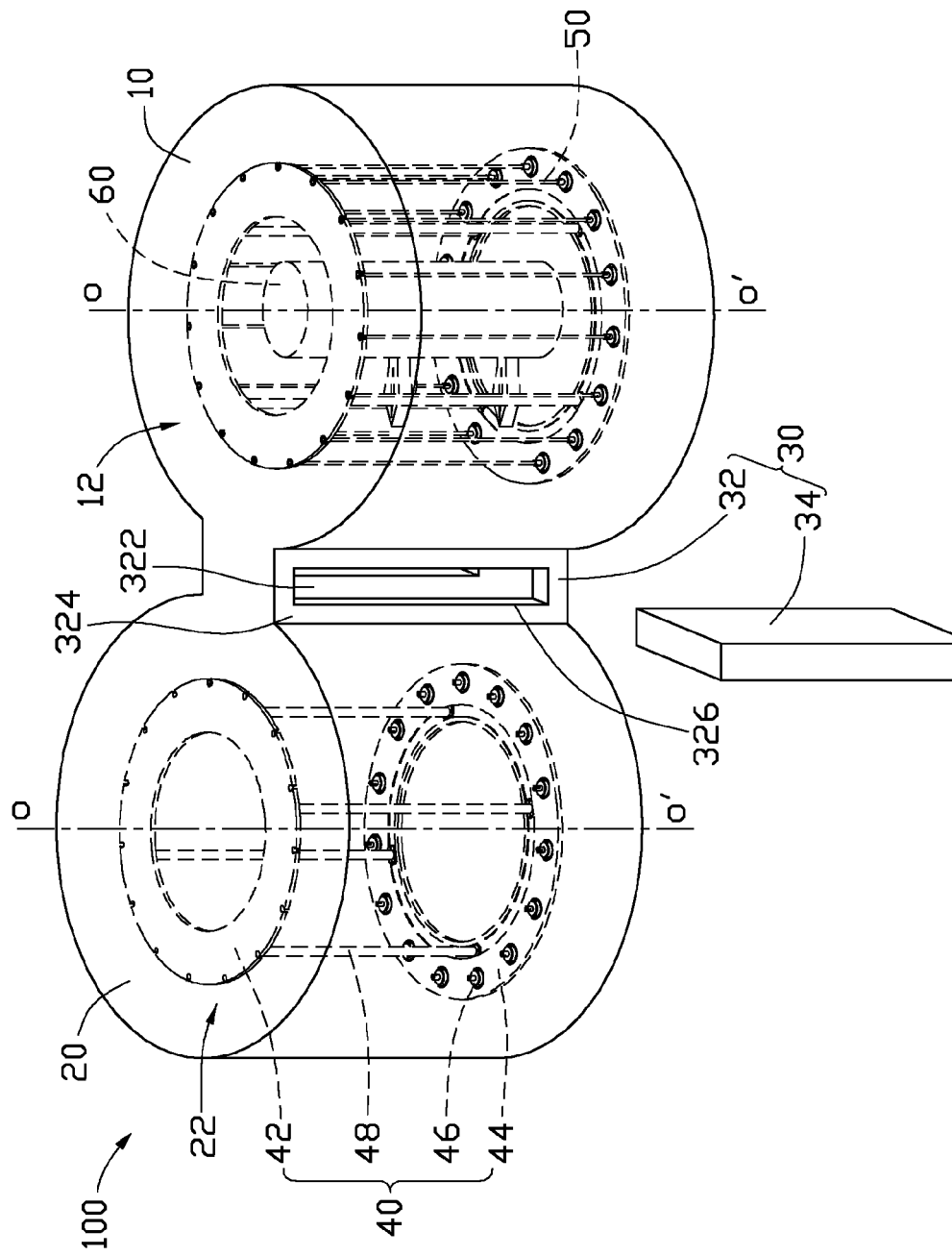
FIG. 1 is a schematic, isometric view of a sputtering apparatus including two rotatable assemblies and a transferring robot, according to an exemplary embodiment, showing the transferring robot in a first state.
Figure 2:
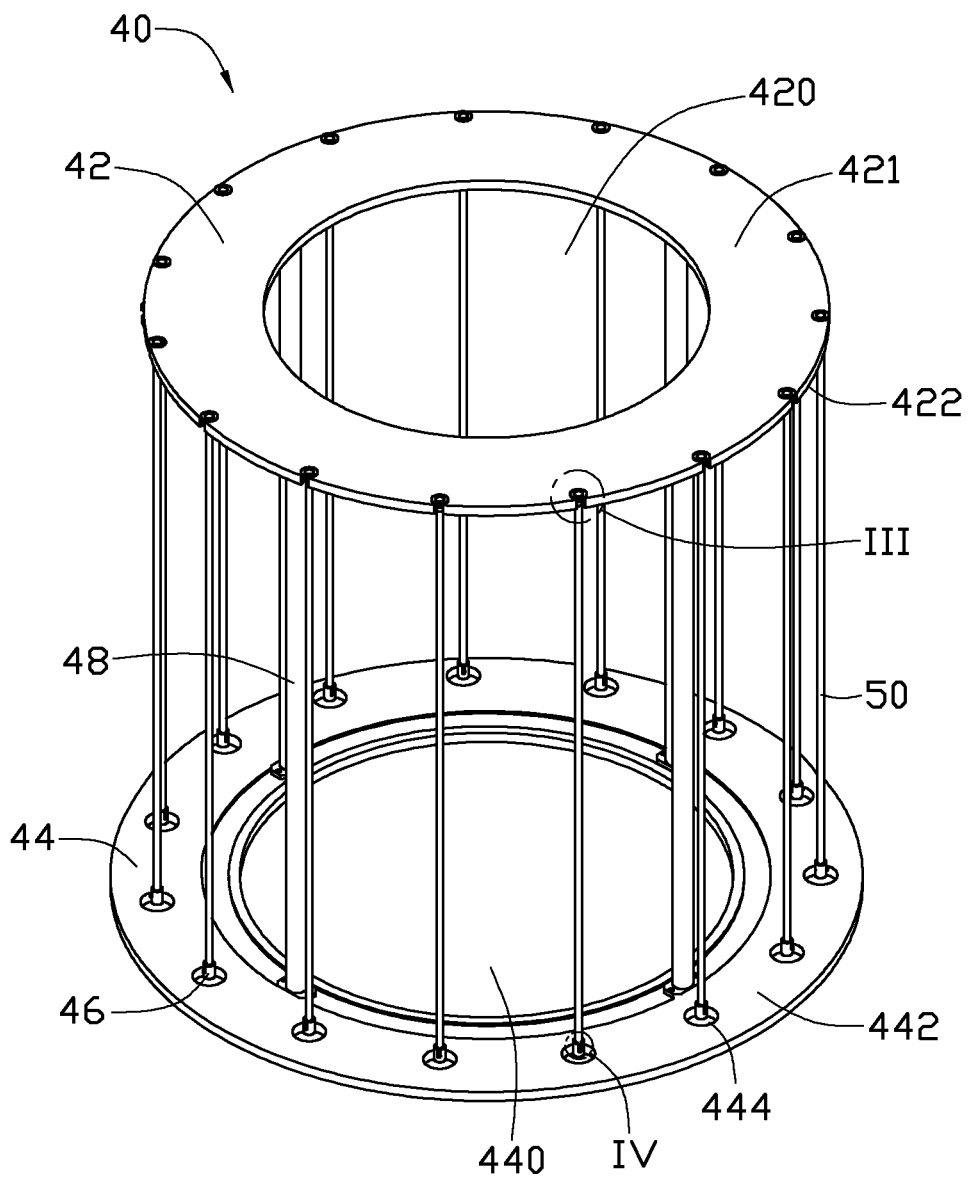
FIG. 2 is a schematic, isometric view of the rotatable assembly with posts of FIG. 1.
Figure 3:
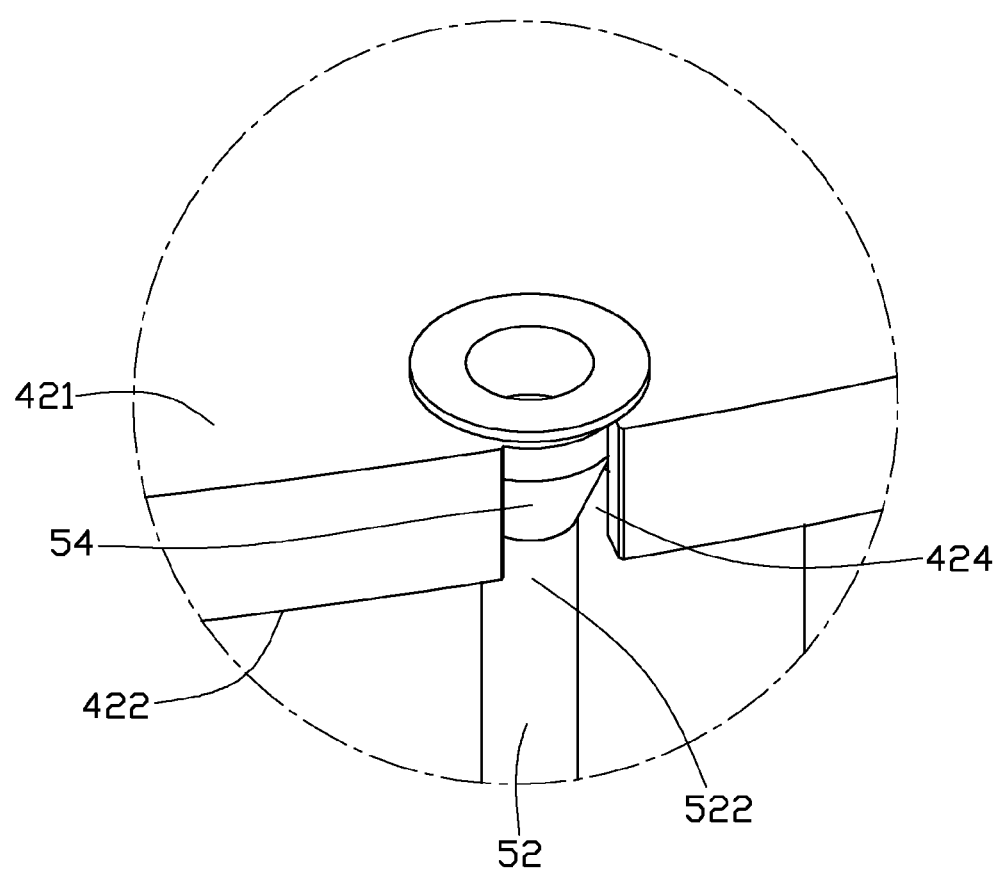
FIG. 3 is an enlarged view of a circled part III of the rotatable assembly of FIG. 2.
Figure 4:
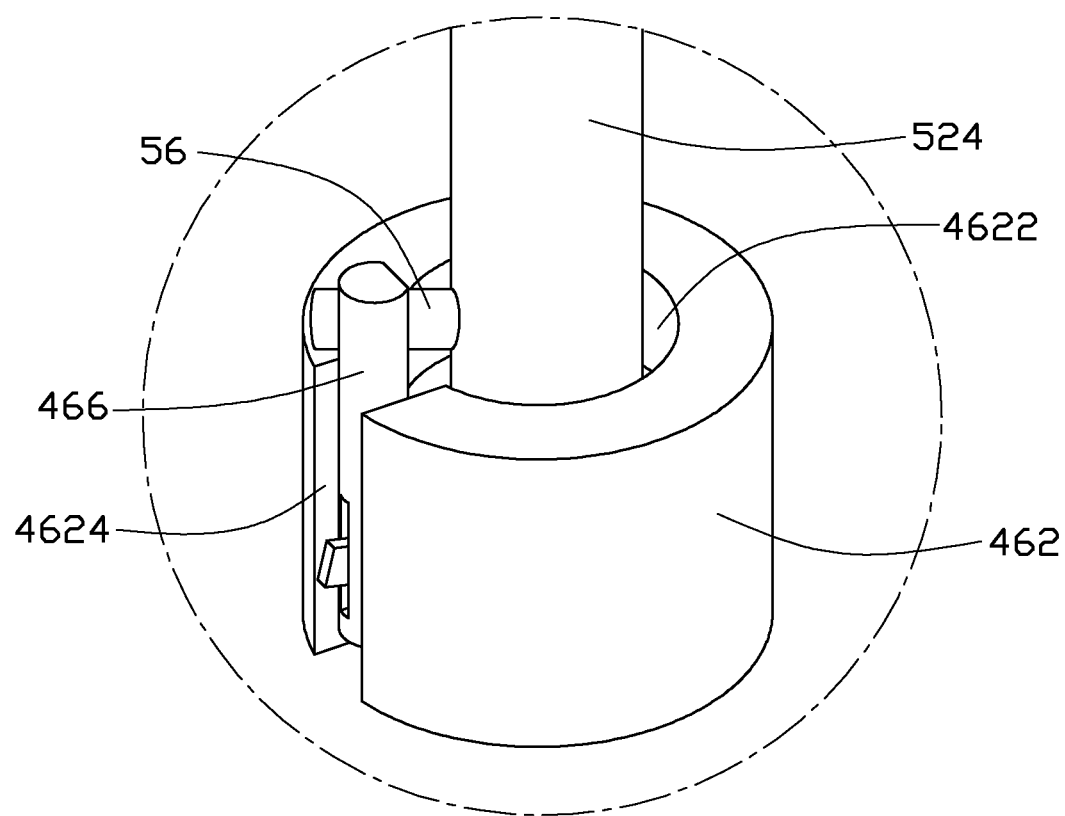
FIG. 4 is an enlarged view of a circled part IV of the rotatable assembly of FIG. 2.
Figure 5:
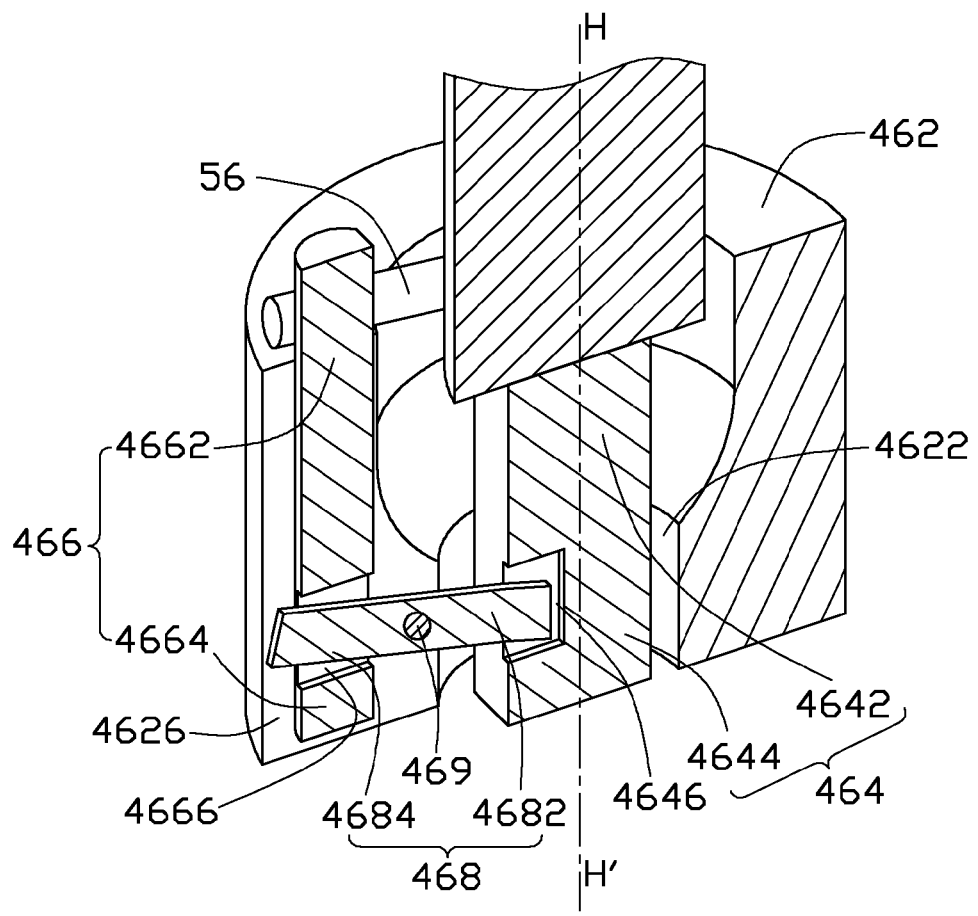
FIG. 5 is a partially, enlarged sectional view of the sputtering apparatus of FIG. 2.
Figure 6:
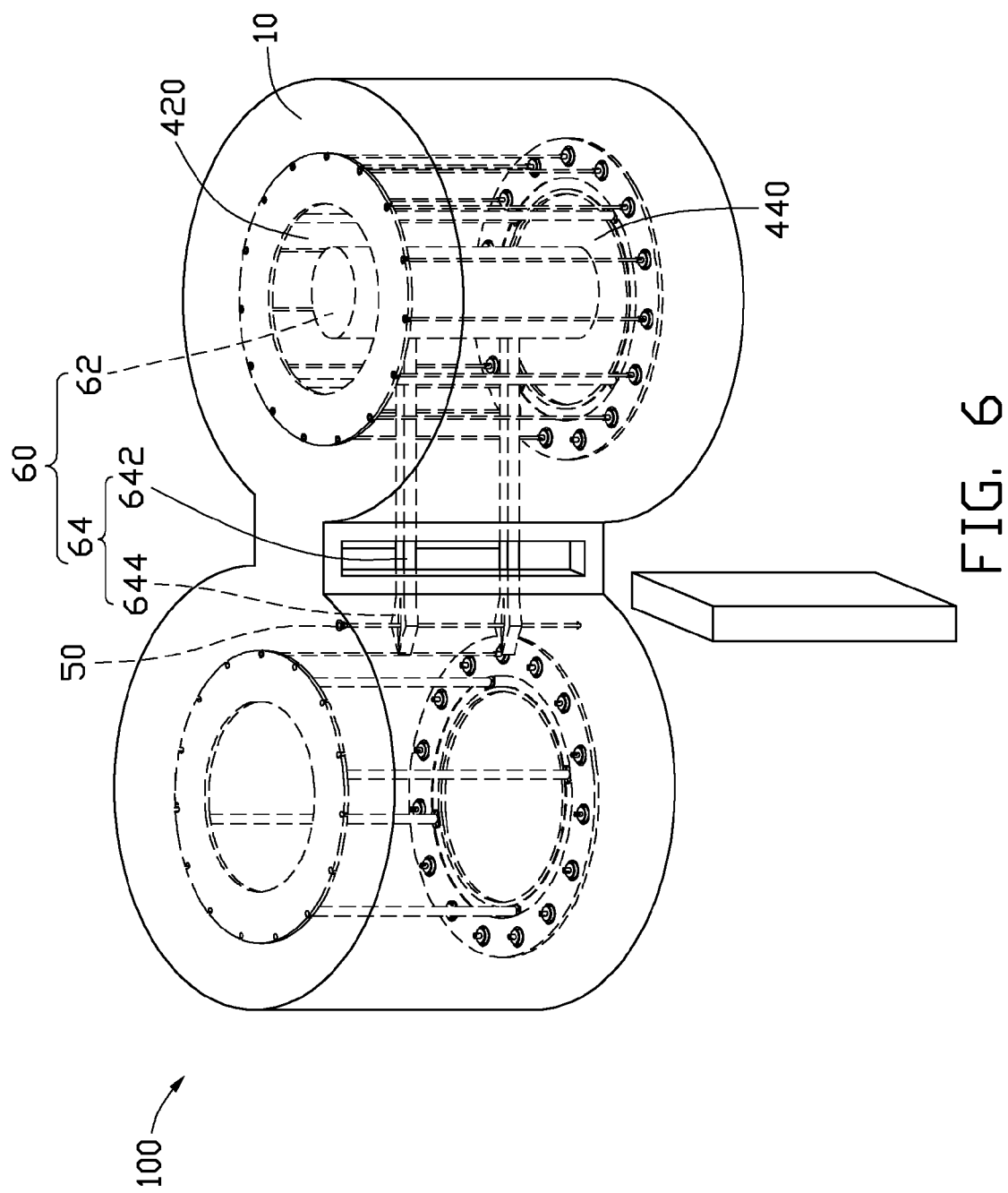
FIG. 6 is similar to FIG. 1, but showing the transferring robot in a second state.

Referring to FIG. 1, a sputtering apparatus 100 for coating a number of workpieces (not shown), according to an exemplary embodiment, includes a preheating chamber 10, a deposition chamber 20, a connection assembly 30, two support assemblies 40, a number of posts 50, and a transferring robot 60.

The structure of the preheating chamber 10 is the same as that of the deposition chamber 20 in this embodiment. The preheating chamber 10 defines a preheating cavity 12. The deposition chamber 20 defines a deposition cavity 22. The connection assembly 30 includes a connection member 32 and a partition plate 34. The connection member 32 connects the preheating chamber 10 to the deposition chamber 20. The connection member 32 defines a passage 322. The passage 322 communicates with the preheating cavity 12 and the deposition cavity 22. The partition plate 34 is moveably coupled to the connection member 32 and configured for selectively closing or opening the passage 322. In this embodiment, the connection member 32 is substantially cuboid and includes four sidewalls. An opening 326 is defined in a sidewall 324 of the connection member 32. The partition plate 34 conforms to the opening 326 and the passage 322. The partition plate 34 extends through the opening 326 and is received in the passage 322 in an airtight manner. The passage 322 is sealed and divided into two sub-passages (not shown) by the partition plate 34. That is, the preheating cavity 12 is isolated from the deposition chamber 20 by the partition plate 34.

The two support assemblies 40 have the same structure. One support assembly 40 (the first support assembly) is received in the preheating cavity 12, and the other support assembly 40 (the second support assembly) is received in the deposition cavity 22. Each support assembly 40 defines a central axis OO' thereof. The support assembly 40 is rotatable about the central axis OO'.

Referring to FIGS. 2-5, the support assembly 40 includes an upper base 42, a lower base 44, a number of seat members 46 corresponding to the posts 50, and four connection posts 48.

The upper base 42 is an annular planar plate and defines an upper through hole 420 at a center thereof. The upper base 42 includes a first surface 421 and a second surface 422. The first surface 421 and the second surface 422 are at opposite sides of the upper base 42. A number of cutouts 424 through the first surface 421 and the second surface 422 are defined in a peripheral edge of the upper base 42 opening toward a direction away from the central axis OO'. The cutouts 424 substantially taper away from the upper through hole 420. The diameter of each cutout 424 decreases from the first surface 421 to the second surface 422. In this embodiment, the cutouts 424 are equidistant from each other around the central axis OO'.

The lower base 44 is an annular planar plate and defines a lower through hole 440 aligned with the upper through hole 420. The lower base 44 includes a third surface 442 opposite to the second surface 422. A number of first receiving holes 444 are defined in the third surface 442 aligned with the cutouts 424 and corresponding to the seat members 46.

Each seat member 46 is rotatably received in a corresponding first receiving hole 444. Each seat member 46 includes a receiving post 462, a support post 464, a drive post 466, and a lever bar 468.

The receiving post 462 is received in a corresponding first receiving hole 444 and is rotatable about a longitudinal axis HH' of the receiving post 462. The receiving post 462 defines a second receiving hole 4622. A slot 4624 is defined in a sidewall 4626 surrounding around the second receiving hole 4622 of the receiving post 462.

The support post 464 is received in the second receiving hole 4622 and includes an upper end 4642 and a lower end 4644. The upper end 4642 and the lower end 4644 are at opposite sides of the support post 464. A first engagement hole 4646 is defined in the lower end 4646 of the support post 464.

The drive post 466 is positioned in the slot 4624 and includes an upper portion 4662 and a lower portion 4664. A second engagement hole 4666 is defined in the lower portion 4664 of the drive post 466.

The lever bar 468 is pivotally jointed to the sidewall 4626 of the receiving post 462 in the slot 4624 at middle of the lever bar 468 by a pivot 469. The lever bar 468 includes a first connection end 4682 and a second connection end 4684. The first connection end 4682 and the second connection end 4684 are at opposite sides of the lever bar 468. The first connection end 4682 is pivotally jointed to the lower end 4644 in the first engagement hole 4646. The second connection end 4684 is pivotably jointed to the lower portion 4664 in the second engagement hole 4666. In a natural state, the drive post 466 is totally received in the slot 4624. The support post 464 and the drive post 466 cooperatively make the lever bar 468 maintain a horizontal balance. The lever bar 468 is rotatable about the pivot 469 under pressure of the support post 464, the drive post 466, and the post 50. In this embodiment, the length of the support post 464 is less than that of the drive post 466.

The four connection posts 48 are interconnected between the second surface 422 and the third surface 442. The four connection posts 48 are spaced from the cutouts 424 and the first receiving holes 444. In this embodiment, the four connection posts 48 are equidistant around the central axis OO'.

The posts 50 are mountable on the support assembly 40 and are configured for fixing the workpieces thereon. Each post 50 includes a rod body portion 52, an engagement portion 54, and a protrusion 56. The rod body portion 52 is a cylinder and includes a first end 522 and a second end 524 conforming to the second receiving hole 4622. The first end 522 and the second end 524 are at opposite sides of the rod body portion 52. The engagement portion 54 extends from the first end 522 along the longitudinal axis of the rod body portion 52. The engagement portion 54 has a greater size than that of the rod body portion 52. The diameter of the rod body portion 52 is less than that of the least diameter of the cutout 424. The engagement portion 54 has a tapered section conforming to the cutout 424. The protrusion 56 extends radially from the second end 524.

When a post 50 is mounted on the support assembly 40, the post 50 is lifted to raise the engagement portion 54 above the first surface 421 and to elevate the second end 524 above the receiving post 462. The post 50 is then moved toward the third surface 442 until the engagement portion 54 engages in the cutout 424 and the second end 524 is received in the second receiving hole 4622 to press the support post 464. The support post 464 moves downward to make the lever bar 468 rotate about the pivot 469. The drive post 466 moves upward to be exposed at the receiving post 462. When the receiving post 462 rotates about the longitudinal axis HH', the lever bar 468, the support post 464, and the drive post 466 rotate about the longitudinal axis HH' with the rotation of the receiving post 462. The post 50 rotates about the longitudinal axis HH' as the drive post 466 engages with the protrusion 56. When the post 50 is demounted from the support assembly 40, the post 50 is lifted to raise the engagement portion 54 above the first surface 421 and to elevate the second end 524 above the drive post 466. The post 50 is then radially moved away from the central axis OO' to separate from the support assembly 40. As a result, the mounting and demounting efficiency of the posts 50 is increased. Therefore, the coating efficiency is increased.

The transferring robot 60 includes a receiving case 62, a driving member (not shown), and two manipulators 64. The receiving case 62 is positioned in the preheating chamber 10 and passes through the upper through hole 420 and the lower through hole 440. The driving member is received in the receiving case 62. Each manipulator 64 includes an arm 642 and a clamp 644 arranged on the arm 642. The arms 642 are received in the receiving case 62, and the clamps 644 are exposed at the receiving case 62. The driving member is mechanically and electrically connected to the manipulators 64. When the driving member is implemented, the arms 642 protrude out of or retract into the receiving case 62. The arms 642 can also move downward or upward and the clamps 644 grip a post 50. In this embodiment, the arms 642 are extendable or retractable along a direction perpendicular to the central axis OO', the arms 642 are moveable along the central axis OO' direction. The manipulators 64 are configured for demounting the post 50 from the support assembly 40 in the preheating chamber 10, transferring the demounted post 50 from the preheating chamber 10 to the deposition chamber 20, mounting the transferred post 50 on the support assembly 40 in the deposition chamber 20, demounting the post 50 from the support assembly 40 in the deposition chamber 20, transferring the demounted post 50 from the deposition chamber 20 to the preheating chamber 10, and mounting the transferred post 50 on the support assembly 40 in the preheating chamber 10.

A sputtering method for coating a number of workpieces (not shown) can be implemented by, for example, the sputtering apparatus 100 and includes the following steps. Workpieces are placed in the preheating chamber 10. In particular, after the workpieces are fixed on the posts 50, the posts 50 are mounted on the support assembly 40 in the preheating chamber 10. Each post 50 is manually or automatically lifted to elevate the engagement portion 54 above the first surface 421 and to raise the second end 524 above the receiving post 462. The post 50 is then moved toward the third surface 442 until the engagement portion 54 engages in the cutout 424 and the second end 524 is received in the second receiving hole 4622. The post 50 is manually rotated to make the protrusion 56 engage with the drive post 466.

The preheating chamber 10 is evacuated. In particular, air from the preheating chamber 10 is evacuated by a vacuum pump (not shown).

The preheating chamber 10 is heated. In particular, the workpieces therein are preheated by a heater (not shown). In this step, the support assembly 40 in the preheating chamber 10 rotates about the central axis OO' and the posts 50 rotate about the longitudinal axis HH' with the rotation of the seat member 46.

The posts 50 are transferred from the preheating chamber 10 to the deposition chamber 20 through the passage 322 and mounted on the support assembly 40 in the deposition chamber 20. In particular, the clamps 644 clamp a post 50 in the preheating chamber 10. The arms 642 moves upward along the central axis OO' direction until the engagement portion 54 is above the first surface 421 and the second end 524 is above the receiving post 462. The arms 642 then protrude out of the preheating chamber 10 and enter the deposition chamber 20 to correspond to the support assembly 40 therein. The arms 642 finally move downward along the central axis OO' direction until the engagement portion 54 engages in the cutout 424 and the second end 524 is received in the second receiving hole 4622. The clamps 644 release the post 50 and the arms 642 retract into the receiving case 62 for transferring the next post 50. Operations are thus repeated until all posts 50 are transferred from the preheating chamber 10 to the deposition chamber 20.

The passage 322 is closed to isolate the preheating cavity 12 from the deposition cavity 22. In particular, the partition plate 34 extends through the opening 326 and is received in the passage 322 in an airtight manner so that the passage 322 is sealed and is divided into two sub-passages (not shown) by the partition plate 34.

The deposition chamber 20 is evacuated. In particular, air is evacuated from the deposition chamber 20 by a vacuum pump (not shown).

The workpieces are coated in the deposition chamber 20 using a sputtering process. In particular, an inert gas is introduced in the deposition chamber 20 to excite energized ions. The energized ions bombard a solid target material (not shown) to vaporize the material. The vaporized material is then deposited on the workpieces.

The passage 322 is opened. In particular, the partition plate 34 is removed from the the passage 322.

The posts 50 with coated workpieces are transferred from the deposition chamber 20 to the preheating chamber 10 and mounted on the support assembly 40 in the preheating chamber 10.

The passage 322 is closed to maintain the deposition chamber 20 in a vacuum state.

The preheating chamber 10 is opened and the coated workpieces are removed.

The steps can be repeated to process subsequent workpieces. During the method as disclosed, the deposition chamber 20 maintains a vacuum state so the target material is not oxidized nor is contaminated by dust. This increases coating efficiency and quality.

In other embodiments, the sputtering apparatus 100 includes only one chamber, a support assembly, and a number of posts. The posts are fixed on the support assembly. The support assembly is positioned in the chamber. The preheating step and the deposition step are implemented in the chamber.

It is to be understood, however, that even though numerous characteristics and advantages of the present embodiments have been set forth in the foregoing description, together with details of the structures and functions of the embodiments, the disclosure is illustrative only, and changes may be made in details, especially in matters of shape, size, and arrangement of parts within the principles of the invention to the full extent indicated by the broad general meaning of the terms in which the appended claims are expressed.

What is claimed is:

1. A sputtering apparatus, comprising:
a preheating chamber;
a deposition chamber;
a connection assembly connecting the preheating chamber to the deposition chamber, the connection assembly comprising a connection member defining a passage in communication with the preheating chamber and the deposition chamber and a partition plate moveably coupled to the connection member, the partition plate configured for selectively closing or opening the passage;
a first support assembly received in the preheating chamber;
a second support assembly received in the deposition chamber; each first and second support assembly comprising an upper base, a lower base, a plurality of seat members, and at least two connection posts interconnected between the upper base and the lower base, the upper base defining a plurality of cutouts, the seat members rotatably mounted on the lower base and aligned with the cutouts, each seat member comprising a hollow receiving post defining a slot in a sidewall thereof, a support post moveably and rotatably received in the receiving post, a lever bar pivotally connected to the sidewall in the slot by a pivot and being rotatable about the pivot, and a drive post moveably received in the slot, the drive post and the support post coupled to opposite ends of the lever bar and being movable along a longitudinal axis of the receiving post with the rotation of the lever bar, each seat member being rotatable about the longitudinal axis of the receiving post;
a plurality of posts capable of mounting on each of the first and second support assemblies and configured for fixing the workpieces, each post comprising a rod body portion having a first end and an opposite second end, an engagement portion at the first end having a greater size than that of the rod body portion, and a protrusion extending from the second end, the engagement portion engaging in the cutouts, the second end received in the receiving post and resting on the support post, and each drive post configured for abutting against the protrusion of the corresponding post thus driving the post to revolve when the receiving post rotates; and
a transferring robot arranged in the preheating chamber, the transferring robot configured for demounting the posts from the two supporting assemblies and mounting the posts on the two supporting assemblies and transferring the posts between the preheating cavity and the deposition cavity.

2. The sputtering apparatus as claimed in claim 1, wherein each of the first and second support assembly is rotatable about a central axis thereof, the upper base is an annular planar plate and defines an upper through hole at a center thereof, and the cutouts are defined in a peripheral edge of the upper base with each cutout opening toward a direction away from the central axis.

3. The sputtering apparatus as claimed in claim 2, wherein the upper base comprises a first surface and a second surface facing the lower base, the first surface is opposite to the second surface, each cutout tapers in the direction away from the central axis, and a horizontal width of each cutout as measured along a radial direction of the upper base decreases along a direction from the upper base to the lower base.

4. The sputtering apparatus as claimed in claim 3, wherein the lower base is an annular planar plate and comprises a third surface opposite to the second surface, a plurality of first receiving holes are defined in the third surface aligned with the respective cutouts, the seat members are rotatably received in the corresponding first receiving holes, and the cutouts and the seat members are cooperatively configured for engaging with the respective posts.

5. The sputtering apparatus as claimed in claim 1, wherein the connection member defines an opening in communication with the passage, and the partition plate is passable through the opening.

6. The sputtering apparatus as claimed in claim 5, wherein the transferring robot comprises a receiving case, a driving member, and two manipulators, the driving member is received in the receiving case and is mechanically and electrically connected to the manipulators, the manipulators are configured for demounting the post from the first support assembly, transferring the demounted post from the preheating chamber to the deposition chamber, mounting the transferred post on the second support assembly, demounting the post from the second support assembly, transferring the demounted post from the deposition chamber to the preheating chamber, and mounting the transferred post on the first support assembly.

7. The sputtering apparatus as claimed in claim 6, wherein each manipulator comprises an arm and a clamp arranged on the arm and configured for clamping the post, the arm is received in the receiving case, the clamp is exposed at the receiving case, the arm is extendable or retractable along a direction perpendicular to the central axis, and the arm is movable along the central axis direction.

8. The sputtering apparatus as claimed in claim 1, wherein a second receiving hole is defined in the receiving post and communicates with the slot, and the drive post is configured to move upward to be exposed at the receiving post and abut against the post when the post rests on the support post and move downward to be totally received in slot when the post leaves the support post.

9. The sputtering apparatus as claimed in claim 1, wherein the lever bar comprises a first connection end and a second connection end, the first connection end and the second connection end are positioned at opposite sides of the pivot, the first connection end is pivotally connected to the support post, and the second connection end is pivotally connected to the drive post.

10. The sputtering apparatus as claimed in claim 1, wherein the support post comprises an upper end and a lower end opposite to the upper end, the upper end supports the second end of the post, the lower end defines a first engagement hole, the drive post comprises an upper portion and a lower portion, the upper portion is configured for abutting against the protrusion, the lower portion defines a second engagement hole, the first connection end is pivotally connected to the lower end in the first engagement hole, and the second connection end is pivotally connected to the lower portion in the second engagement hole.

\* \* \* \* \*